United States Patent
Zhang et al.

(10) Patent No.: US 10,290,663 B2
(45) Date of Patent: May 14, 2019

(54) MANUFACTURING METHOD OF THIN FILM TRANSISTOR AND MANUFACTURING METHOD OF ARRAY SUBSTRATE

(71) Applicant: Shenzhen China Star Optoelectronics Technology Co., Ltd., Shenzhen, Guangdong (CN)

(72) Inventors: Bufang Zhang, Guangdong (CN); Songshan Li, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 194 days.

(21) Appl. No.: 15/127,371

(22) PCT Filed: Jul. 20, 2016

(86) PCT No.: PCT/CN2016/090591
§ 371 (c)(1),
(2) Date: Sep. 19, 2016

(87) PCT Pub. No.: WO2018/000478
PCT Pub. Date: Jan. 4, 2018

(65) Prior Publication Data
US 2018/0190686 A1    Jul. 5, 2018

(30) Foreign Application Priority Data
Jul. 1, 2016 (CN) .......................... 2016 1 0513993

(51) Int. Cl.
*H01L 21/00* (2006.01)
*H01L 27/12* (2006.01)
(Continued)

(52) U.S. Cl.
CPC ........ *H01L 27/1281* (2013.01); *H01L 27/124* (2013.01); *H01L 27/1222* (2013.01);
(Continued)

(58) Field of Classification Search
CPC ............. H01L 27/1281; H01L 27/1288; H01L 29/66757; H01L 21/26513; H01L 27/1222; H01L 29/78675
See application file for complete search history.

(56) References Cited

U.S. PATENT DOCUMENTS

2006/0003502 A1    1/2006  Kakkad et al.

FOREIGN PATENT DOCUMENTS

| CN | 104900491 A | 9/2015 |
| CN | 105161459 A | 12/2015 |
| JP | 2010177325 A | 8/2010 |

*Primary Examiner* — Richard A Booth
(74) *Attorney, Agent, or Firm* — Andrew C. Cheng

(57) ABSTRACT

The invention provides a manufacturing method of a thin film transistor and a manufacturing method of an array substrate. A photoresist is used to define a to-be-doped region of an amorphous silicon layer to thereby make a crystallization be occurred in a source contact region and a drain contact region. A crystallization direction is from the source contact region and the drain contact region towards a channel region, so that it can realize directional crystallization as far as possible, and therefore can improve crystallization efficiency and crystallization uniformity, reduce an influence of grain boundary applied to electron mobility and leakage current of the TFT and improve electrical characteristics of the TFT.

10 Claims, 6 Drawing Sheets

(51) Int. Cl.
  *H01L 29/66* (2006.01)
  *H01L 29/786* (2006.01)
  *H01L 21/265* (2006.01)
  *H01L 21/266* (2006.01)

(52) U.S. Cl.
  CPC ...... *H01L 27/1274* (2013.01); *H01L 27/1288* (2013.01); *H01L 29/66757* (2013.01); *H01L 29/66765* (2013.01); *H01L 29/78675* (2013.01); *H01L 21/266* (2013.01); *H01L 21/26513* (2013.01); *H01L 27/1296* (2013.01)

MANUFACTURING METHOD OF THIN FILM TRANSISTOR AND MANUFACTURING METHOD OF ARRAY SUBSTRATE

TECHNICAL FIELD

The invention relates to the field of liquid crystal display technology, and more particularly to a manufacturing method of a thin film transistor and a manufacturing method of an array substrate.

DESCRIPTION OF RELATED ART

In a related manufacturing process of a thin film transistor (TFT), an ion implanter performs an entire surface doping process to deposited amorphous silicon (a-Si), then a rapid thermal annealing (RTA) crystallization process is performed for the amorphous silicon doped with dopant ions to obtain an active layer of the TFT. The crystallization process essentially is performing an entire surface crystallization to the amorphous silicon after implanting dopant ions. The crystallization direction of particles of the amorphous silicon is random, crystallization efficiency and crystallization uniformity are low and it is prone to appear more grain boundaries, thereby an electron mobility of the TFT is reduced and electrical characteristics of the TFT are affected.

SUMMARY

Accordingly, the invention provides a manufacturing method of a thin film transistor and a manufacturing method of an array substrate, which could obtain directional crystallization as much as possible to improve crystallization efficiency and crystallization uniformity, reduce the influence of grain boundary applied to electron mobility and leakage current of TFT and thereby improve electrical characteristics of the TFT.

An embodiment of the invention provides a manufacturing method of a thin film transistor includes: providing a substrate; sequentially forming an amorphous silicon layer and a photoresist layer on the substrate, and using a mask to perform a patterning process to the photoresist layer and thereby forming spacedly-disposed photoresist patterns; performing a doping process to the amorphous silicon layer being not covered by the photoresist pattern, wherein dopant ions in the doping process include boron ions; stripping off the photoresist patterns and performing a rapid thermal annealing crystallization process to the amorphous silicon layer to thereby make a doping processed region of the amorphous silicon layer form a source contact region and a drain contact region and make a region covered by the photoresist patterns form a channel region; forming a gate insulating layer on the amorphous silicon layer after being performed with the rapid thermal annealing crystallization process; and forming a gate pattern on the gate insulating layer, wherein the gate pattern is located between the source contact region and the drain contact region and correspondingly located above the channel region.

In an embodiment, the manufacturing method further includes: forming an interlayer dielectric layer on the gate pattern; forming contact holes penetrating through the interlayer dielectric layer and the gate insulting layer correspondingly above the source contact region and the drain contact region; forming a source pattern and a drain pattern on interlayer dielectric layer correspondingly above the source contact region and the drain contact region respectively to thereby make the source pattern and the drain pattern respectively be electrically connected with the source contact region and the drain contact region by the contact holes.

Another embodiment of the invention provides a manufacturing method of a thin film transistor includes: providing a substrate; sequentially forming an amorphous silicon layer and a photoresist layer on the substrate, and using a mask to perform a patterning process to the photoresist layer to form spacedly-disposed photoresist pattern; performing a doping process to the amorphous silicon layer being not covered by the photoresist patterns; stripping off the photoresist patterns and performing a rapid thermal annealing crystallization process to the amorphous silicon layer to thereby make a doping processed region of the amorphous silicon layer form a source contact region and a drain contact region and make a region covered by the photoresist patterns form a channel region.

In an embodiment, the manufacturing method further includes: forming a gate insulating layer on the amorphous silicon layer after being performed with the rapid thermal annealing crystallization process; forming a gate pattern on the gate insulating layer, and the gate pattern being located between the source contact region and the drain contact region and correspondingly located above the channel region.

In an embodiment, the manufacturing method further includes: forming an interlayer dielectric layer on the gate pattern; forming contact holes penetrating through the interlayer dielectric layer and the gate insulting layer correspondingly above the source contact region and the drain contact region; forming a source pattern and a drain pattern on the interlayer dielectric layer correspondingly above the source contact region and the drain contact region respectively to thereby make the source pattern and the drain pattern respectively be electrically connected with the source contact region and the drain contact region by the contact holes.

In an embodiment, the step of sequentially forming an amorphous silicon layer and a photoresist layer on the substrate includes: sequentially forming the gate pattern and the gate insulting layer on the substrate; and sequentially forming the amorphous silicon layer and the photoresist layer on the gate insulting layer.

In an embodiment, the manufacturing method further includes: forming an interlayer dielectric layer on the amorphous silicon layer after being performed with the rapid thermal annealing crystallization process; forming contact holes penetrating through the interlayer dielectric layer correspondingly above the source contact region and the drain contact region; forming a source pattern and a drain pattern on the interlayer dielectric layer correspondingly above the source contact region and the drain contact region respectively to thereby make the source pattern and the drain pattern respectively be electrically connected with the source contact region and the drain contact region by the contact holes.

In an embodiment, dopant ions in the doping process include boron ions.

An embodiment of the invention provides a manufacturing method of an array substrate includes: providing a substrate; sequentially forming an amorphous silicon layer and a photoresist layer on the substrate, and using a mask to perform a patterning process to the photoresist layer to form spacedly disposed photoresist patterns; performing a doping process to the amorphous silicon layer being not covered by the photoresist patterns; stripping off the photoresist patterns and performing a rapid thermal annealing crystallization process to the amorphous silicon layer to thereby make a doping processed region of the amorphous silicon layer form a source contact region and a drain contact region and make a region covered by the photoresist patterns form a channel region; forming an interlayer dielectric layer on the amorphous silicon layer after being performed with the rapid thermal annealing crystallization process; forming first contact holes penetrating through the interlayer dielectric layer correspondingly above the source contact region and the drain contact region; forming a source pattern and a drain pattern on the interlayer dielectric layer correspondingly above the source contact region and the drain contact region respectively to thereby make the source pattern and the drain pattern respectively be electrically connected with the source contact region and the drain contact region by the first contact holes; forming a second contact hole for exposing the drain contact region correspondingly above the drain contact region; forming a pixel electrode on the interlayer dielectric layer to thereby make the pixel electrode be electrically connected with the drain contact region by the second contact hole.

In an embodiment, the step of forming an interlayer dielectric layer on the amorphous silicon layer after being performed with the rapid thermal annealing crystallization process includes: forming a gate insulating layer on the amorphous silicon layer after being performed with the rapid thermal annealing crystallization process; forming a gate pattern on the gate insulating layer and the gate pattern being located between the source contact region and the drain contact region and correspondingly located above the channel region; and forming the interlayer dielectric layer on the gate pattern. The step of forming first contact holes penetrating through the interlayer dielectric layer correspondingly above the source contact region and the drain contact region includes: forming the first contact holes penetrating through the interlayer dielectric layer and the gate insulating layer correspondingly above the source contact region and the drain contact region.

In an embodiment, the step of sequentially forming an amorphous silicon layer and a photoresist layer on the substrate includes: sequentially forming a gate pattern and a gate insulting layer on the substrate; and sequentially forming the amorphous silicon layer and the photoresist layer on the gate insulting layer.

In an embodiment, dopant ions used in the doping process include boron ions.

The manufacturing method of a thin film transistor and the manufacturing method of an array substrate of embodiments of the invention use a photoresist pattern to define a to-be-doped region of an amorphous silicon layer, i.e., to define a doping process only being performed onto the amorphous silicon layer corresponding to the source contact region and the drain contact region, so that the crystallization is occurred in the source contact region and the drain contact region and the crystallization direction is from the source contact region and the drain contact region towards the channel region, so as to achieve a directional crystallization as far as possible, and therefore can improve crystallization efficiency and crystallization uniformity, reduce an influence of grain boundary applied to electron mobility and leakage current of the TFT and improve electrical characteristics of the TFT.

DETAILED DESCRIPTION OF EMBODIMENTS

An objective of an embodiment of the invention is to use a photoresist pattern to define a doping region of an amorphous silicon layer, i.e., a doping process is performed only onto a source contact region and a drain contact region to thereby make a crystallization process occurred in the source contact region and the drain contact region. A crystallization direction is from the source contact region and the drain contact region towards the channel region, so as to realize a directional crystallization as far as possible, improve crystallization efficiency and crystallization uniformity, reduce the influence of grain boundary applied to electron mobility and leakage current of the TFT and improve electrical characteristics of the TFT.

In the following, with reference to accompanying drawings of embodiments of the invention, technical solutions of exemplary embodiments provided by the invention will be clearly and completely described. In the case of no conflict, the following embodiments and the technical features of the embodiments can be combined with each other.

Figure 1:
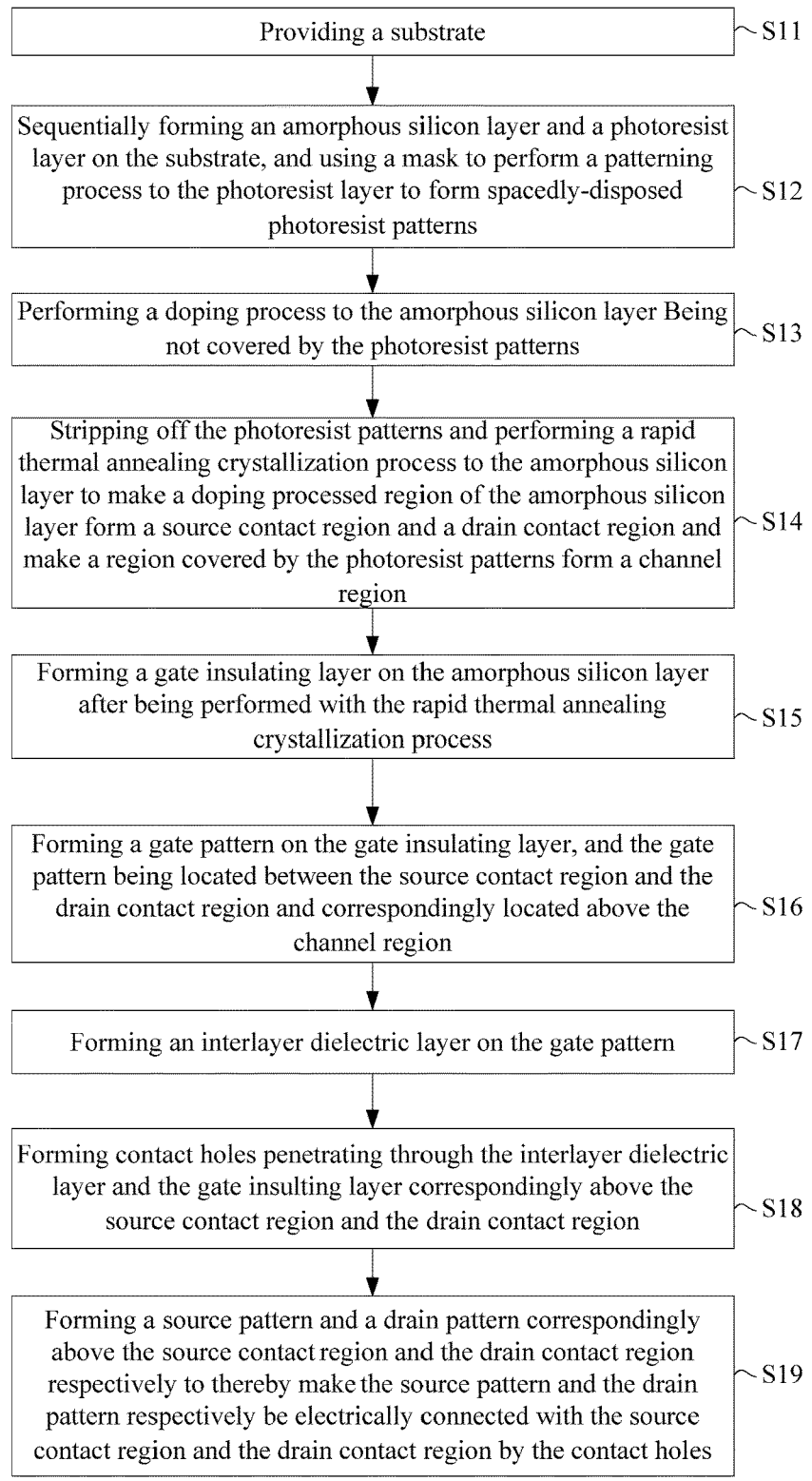
FIG. 1 is a flowchart of a manufacturing method of a thin film transistor according to an embodiment of the invention.

Referring to FIG. 1, FIG. 1 is a flowchart of a manufacturing method of a thin film transistor. The manufacturing method of a thin film transistor may include steps of S11~S19.

S11: providing a substrate.

Figure 2:
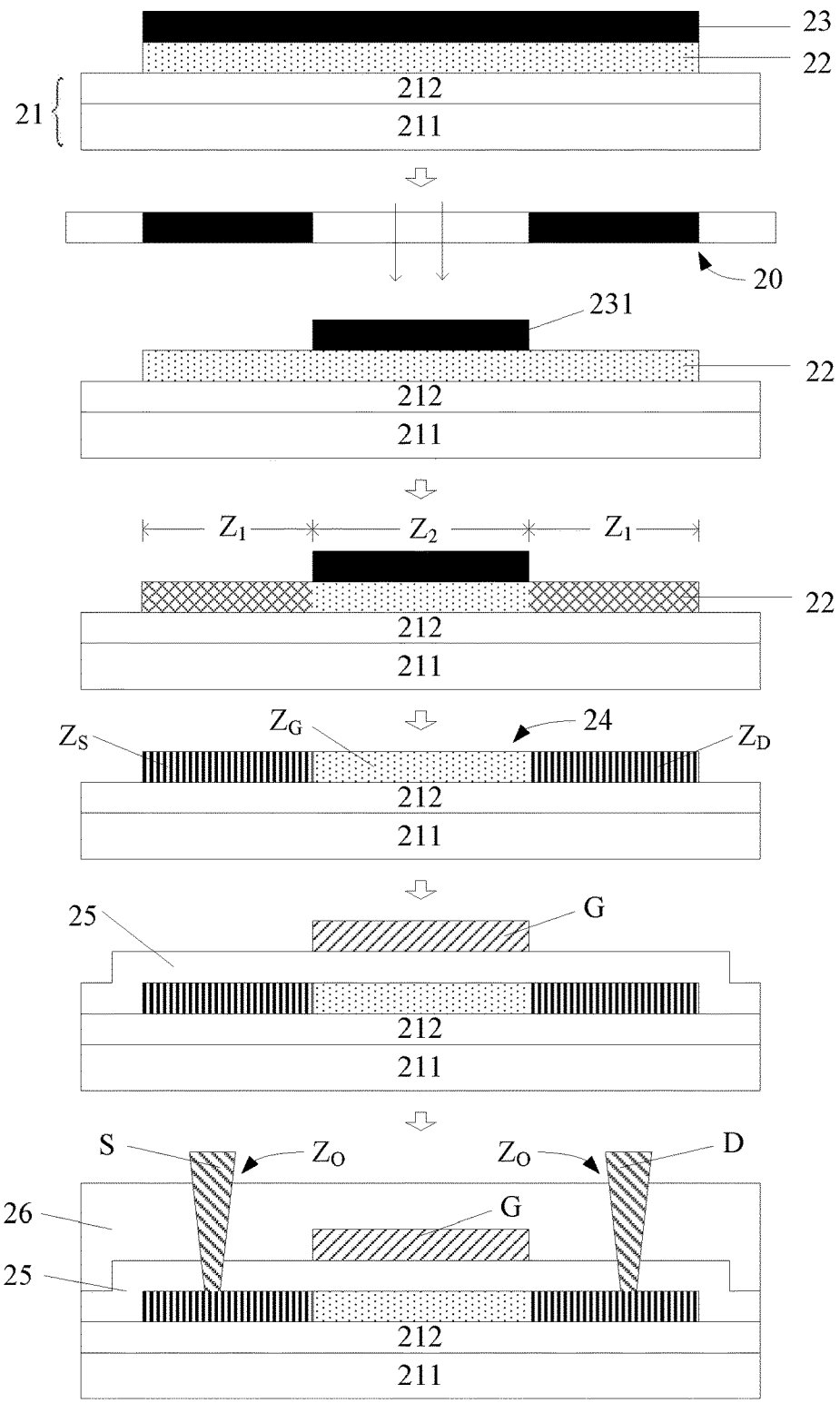
FIG. 2 is a schematic view of scene of the manufacturing method of a thin film transistor based on the illustration of FIG. 1.

The substrate of this embodiment of the invention may be a glass base material, a transparent plastic base material, a flexible base material or other transparent base material. Of course, the substrate further may be disposed with a passivation protective layer, as shown in FIG. 2, the substrate 21 includes a substrate base material 211 and a buffer layer 212 formed on the substrate base material 211. The substrate base material 211 may be a glass base material, a transparent plastic base material, a flexible base material or other transparent base material. The buffer layer 212 acts as a passivation protective layer, and a material thereof include but is not limited to a silicon nitrogen compound, e.g., $Si_3N_4$ (silicon nitride).

S12: sequentially forming an amorphous silicon layer and a photoresist layer on the substrate, and using a mask to perform a patterning process onto the photoresist layer to thereby form spacedly-disposed photoresist patterns.

This embodiment of the invention may use a method such as vacuum evaporation, sputtering, coating or chemical vapor deposition (CVD) to form the amorphous silicon layer 22 on the substrate 21. Furthermore, the illustrated embodiment preferably uses a coating process to form the photoresist layer 23 on the amorphous silicon layer 22. A material of the photoresist layer 23 preferably is a positive photoresist.

An implementation method of the patterning process may be that: when using a mask 20 to irradiate the photoresist layer 23 with light, a part of the photoresist layer 23 being irradiated with light can be removed in a developing process by a developing solution and the other part being not irradiated with light is remained after the developing process to thereby form spacedly-disposed photoresist patterns 231 (only one is shown in the drawing) on the amorphous silicon layer 22. Regions $Z_1$ of the amorphous silicon layer 22 being not covered by the photoresist pattern 231 are used to form the source contact region and the drain contact region of the TFT, a region $Z_2$ of the amorphous silicon layer 22 being covered by the photoresist pattern 231 is used to form the channel region of the TFT.

S13: performing a doping process to the amorphous silicon layer being not covered by the photoresist patterns.

In conjunction with the illustration of FIG. 2, the amorphous silicon layer 22 in the regions $Z_1$ are performed with a doping process. Dopant ions used in the doping process include but are not limited to boron ions.

S14: stripping off the photoresist patterns and performing a rapid thermal annealing crystallization process to the amorphous silicon layer to thereby make a doping processed region of the amorphous silicon layer form a source contact region and a drain contact region and make a region covered by the photoresist patterns form a channel region.

The rapid thermal annealing process makes the amorphous silicon layer 22 be crystallized to form a polycrystalline silicon (poly-Si) semiconductor layer 24 of the TFT. The doping processed regions $Z_1$ form the source contact region $Z_S$ and the drain contact region $Z_D$, and the region $Z_2$ covered by the photoresist patterns forms a channel region $Z_G$ of the TFT.

Because dopant ions in the doping processed regions $Z_1$ are relatively more, the crystallization direction is from the source contact region $Z_S$ and the drain contact region $Z_D$ towards the channel region $Z_G$. Such directional crystallization can improve crystallization efficiency and crystallization uniformity, reduce an influence of grain boundary applied to electron mobility and leakage current of the TFT and improve electrical characteristics of the TFT. In addition, after the crystallization process is finished, the dopant ions in the channel region $Z_G$ are relatively less and the electron mobility is lower, so that a leakage current of the TFT can be reduced. Whereas the dopant ions in the source contact region $Z_S$ and the drain contact region $Z_D$ are relatively more and thus the electron mobility is higher, and therefore it can reduce contact resistance with subsequently formed source electrode and drain electrode.

S15: forming a gate insulating layer on the amorphous silicon layer after being performed with the rapid thermal annealing crystallization process.

It is preferably to use coating, evaporation or sputtering to form the gate insulating layer (GI) 25. Furthermore, preferably, the gate insulating layer 25 may include a silicon oxygen compound layer and a silicon nitrogen compound layer sequentially formed on the polycrystalline semiconductor layer 24, such as $SiO_2$ (silicon dioxide) and $Si_3N_4$, it can further improve abrasion resistance and insulating property of the gate insulating layer 25.

S16: forming a gate pattern on the gate insulating layer, and the gate pattern being located between the source contact region and the drain contact region and correspondingly being located above the channel region.

This embodiment of the invention may use patterning processes of exposure, developing and etching to form the gate pattern G with a predetermined pattern.

S17: forming an interlayer dielectric layer on the gate pattern.

The interlayer dielectric layer (IDL, also known as a dielectric layer) 26 covers the gate pattern G and the gate insulating layer 25.

S18: forming contact holes penetrating through the interlayer dielectric layer and the gate insulting layer correspondingly above the source contact region and the drain contact region.

Please continue to refer to FIG. 2, the illustrated embodiment may form two contact holes $Z_O$ by an etching process. The two contact holes $Z_O$ expose the upper surfaces of the drain contact region $Z_D$ and the source contact region $Z_S$, so that subsequently formed source pattern and drain pattern can be electrically connected to the source contact region $Z_S$ and the drain contact region $Z_D$ respectively by the contact holes $Z_O$.

S19: forming a source pattern and a drain pattern correspondingly above the source contact region and the drain contact region respectively to make the source pattern and the drain pattern respectively be electrically connected with the source contact region and the drain contact region by the contact holes.

A material of the source pattern S and the drain pattern D may be the same as or different from the material of the gate pattern G, for example molybdenum (Chemical formula is Mo).

From the foregoing description, the manufacturing method of the illustrated embodiment only performs a doping process to the amorphous silicon layer 22 being not covered by the photoresist pattern 231, when the amorphous silicon layer 22 is crystallized to form the polycrystalline silicon semiconductor layer, it is equivalent to perform partial crystallization of the amorphous silicon layer 22, and a crystallization direction is from the doped region towards the undoped regions at two sides, so that crystallization efficiency and crystallization uniformity can be improved, the influence of grain boundary applied to electron mobility and leakage current of the TFT can be reduced and electrical characteristics of the TFT are improved consequently.

Figure 3:
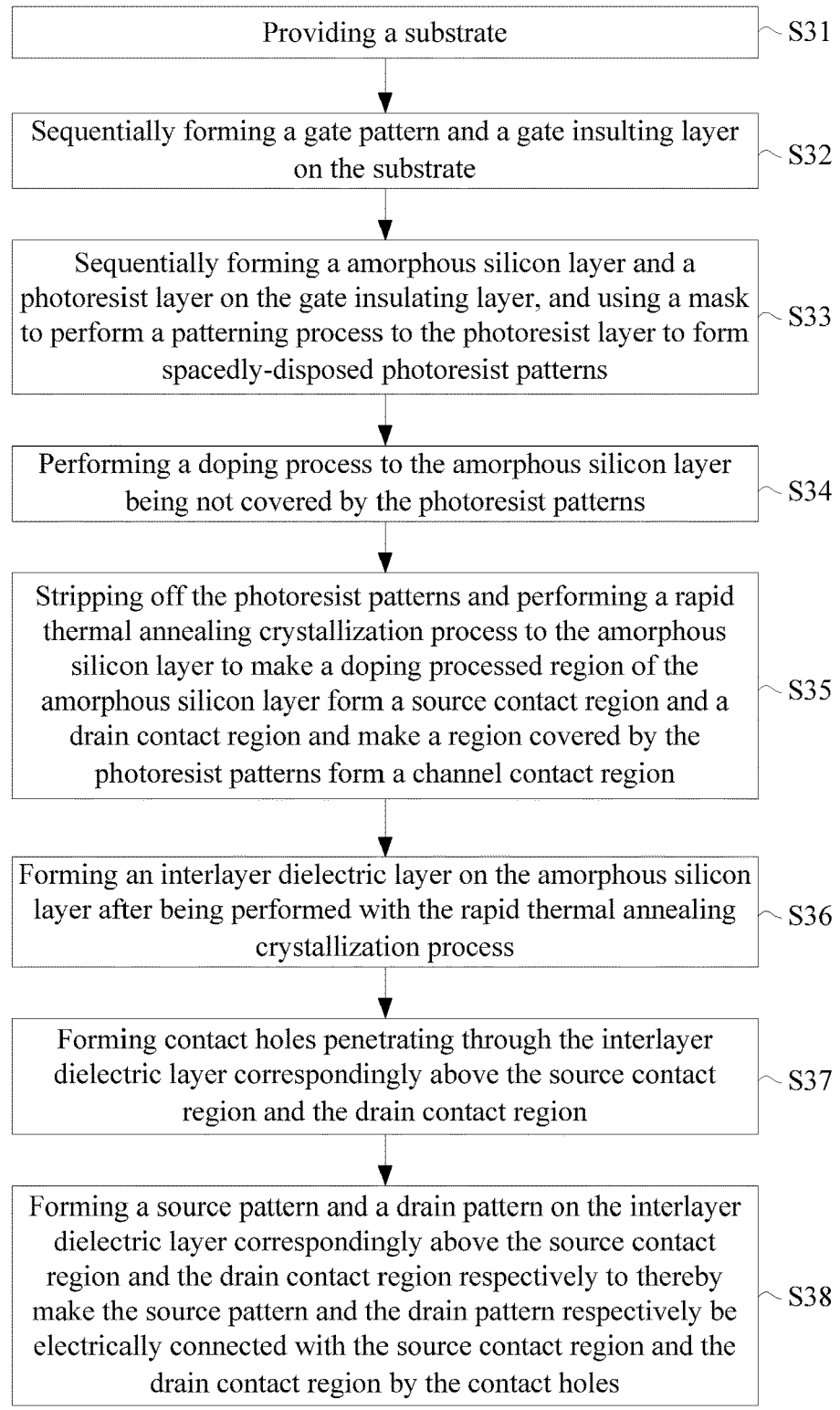
FIG. 3 is a flowchart of a manufacturing method of a thin film transistor according to another embodiment of the invention.

Please continue to refer to FIG. 2, since the gate pattern G is formed above the channel region $Z_G$, the TFT of the illustrated embodiment can be regarded as a top-gate structure. Based on the objective of the invention as mentioned above, an embodiment of the invention also is adapted for a bottom-gate TFT structure. Referring to FIG. 3, A manufacturing method of a thin film transistor may include steps of S31~S39.

S31: providing a substrate.

S32: sequentially forming a gate pattern and a gate insulting layer on the substrate.

S33: sequentially forming an amorphous silicon layer and a photoresist layer on the gate insulating layer, and using a mask to perform a patterning process onto the photoresist layer to thereby form spacedly-disposed photoresist patterns.

S34: performing a doping process to the amorphous silicon layer being not covered by the photoresist patterns.

S35: stripping off the photoresist patterns and performing a rapid thermal annealing crystallization process to the amorphous silicon layer to make a doping processed region of the amorphous silicon layer form a source contact region and a drain contact region and make a region covered by the photoresist patterns form a channel region.

S36: forming an interlayer dielectric layer on the amorphous silicon layer after being performed with the rapid thermal annealing crystallization process.

S37: forming contact holes penetrating through the interlayer dielectric layer correspondingly above the source contact region and the drain contact region.

S38: forming a source pattern and a drain pattern on the interlayer dielectric layer correspondingly above the source contact region and the drain contact region respectively to thereby make the source pattern and the drain pattern respectively be electrically connected with the source contact region and the drain contact region by the contact holes.

On the basis of the description of the embodiment as illustrated in FIG. 2, a difference is that this embodiment disposes the gate pattern and the gate insulating layer below the amorphous silicon layer and the contact holes only penetrate through the interlayer dielectric layer but do not penetrate through the gate insulating layer. Owing to the amorphous silicon layer of this embodiment also can achieve directional crystallization, the TFT prepared by this embodiment also has foregoing beneficial effects.

Figure 4:
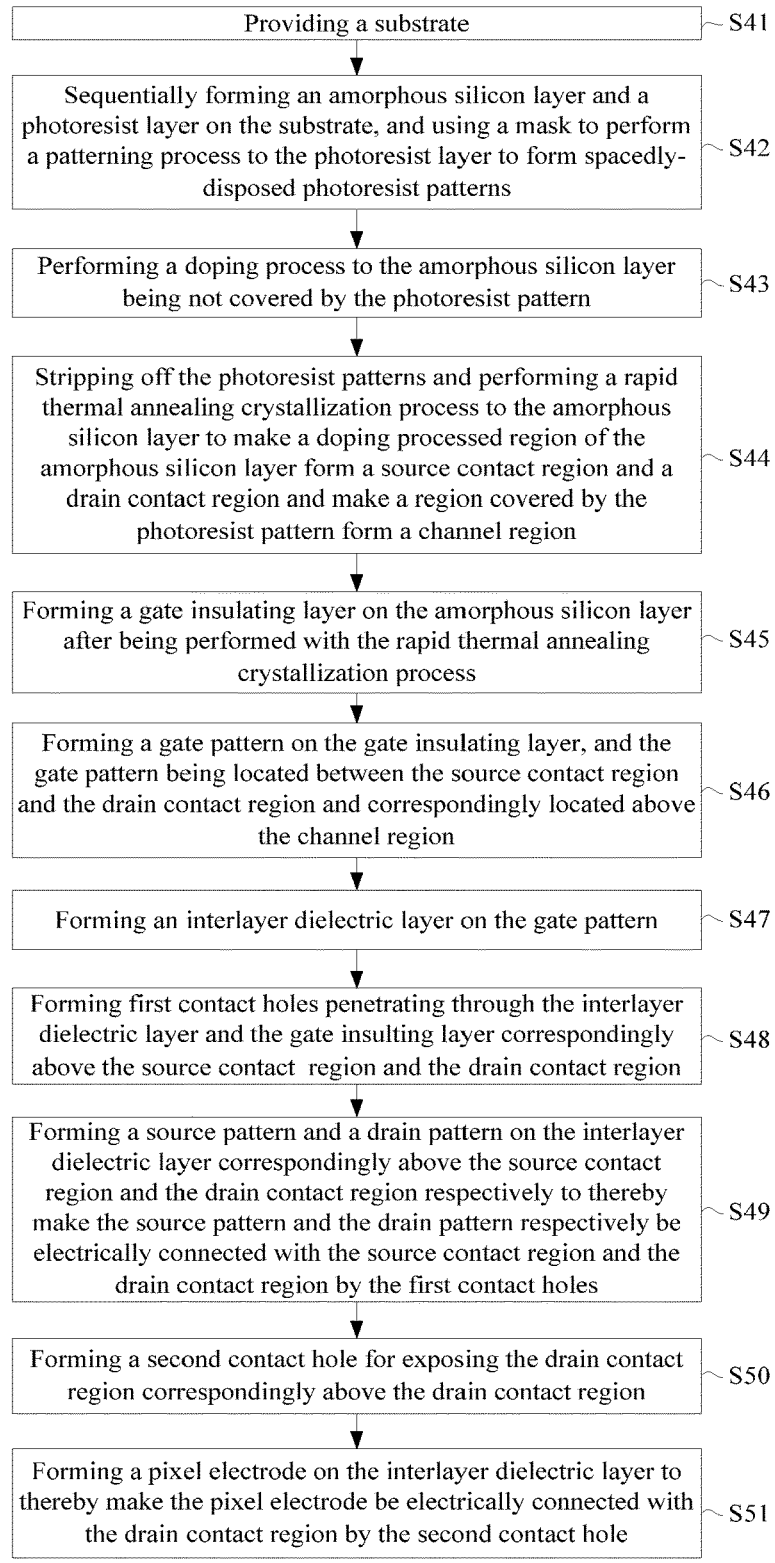
FIG. 4 is a flowchart of a manufacturing method of an array substrate according to an embodiment of the invention.

Please refer to FIG. 4, FIG. 4 is a flowchart of a manufacturing method of an array substrate according to an embodiment of the invention. The manufacturing method of an array substrate may include steps of S41~S51.

S41: providing a substrate.

S42: sequentially forming an amorphous silicon layer and a photoresist layer on the substrate, and using a mask to perform a patterning process onto the photoresist layer to thereby form spacedly-disposed photoresist patterns.

S43: performing a doping process to the amorphous silicon layer being not covered by the photoresist patterns.

S44: stripping off the photoresist patterns and performing a rapid thermal annealing crystallization process to the amorphous silicon layer to thereby make a doping processed region of the amorphous silicon layer form a source contact region and a drain contact region and make a region covered by the photoresist patterns form a channel region.

S45: forming a gate insulating layer on the amorphous silicon layer after being performed with the rapid thermal annealing crystallization process.

S46: forming a gate pattern on the gate insulating layer, and the gate pattern being located between the source contact region and the drain contact region and correspondingly located above the channel region.

S47: forming an interlayer dielectric layer on the gate pattern.

S48: forming first contact holes penetrating through the interlayer dielectric layer and the gate insulting layer correspondingly above the source contact region and the drain contact region.

S49: forming a source pattern and a drain pattern on the interlayer dielectric layer correspondingly above the source contact region and the drain contact region respectively to thereby make the source pattern and the drain pattern respectively be electrically connected with the source contact region and the drain contact region by the first contact holes.

S50: forming a second contact hole for exposing the drain contact region correspondingly above the drain contact region.

S51: forming a pixel electrode on the interlayer dielectric layer to thereby make the pixel electrode be electrically connected with the drain contact region by the second contact hole.

The first contact holes in this embodiment may be regarded as the contact holes $Z_O$ in the embodiment illustrated in FIG. 2 as above mentioned. The steps of S41~S49 are the same as the steps of S11~S48 in the embodiment as illustrated in FIG. 1. For same structural elements, the two embodiments use same reference numerals. In conjunction with the illustration of FIG. 5, the second contact hole $Z_{O2}$ obtained by the steps of S50 and S51 is used to electrically connect the pixel electrode 27 and the drain contact region $Z_S$.

Figure 6:
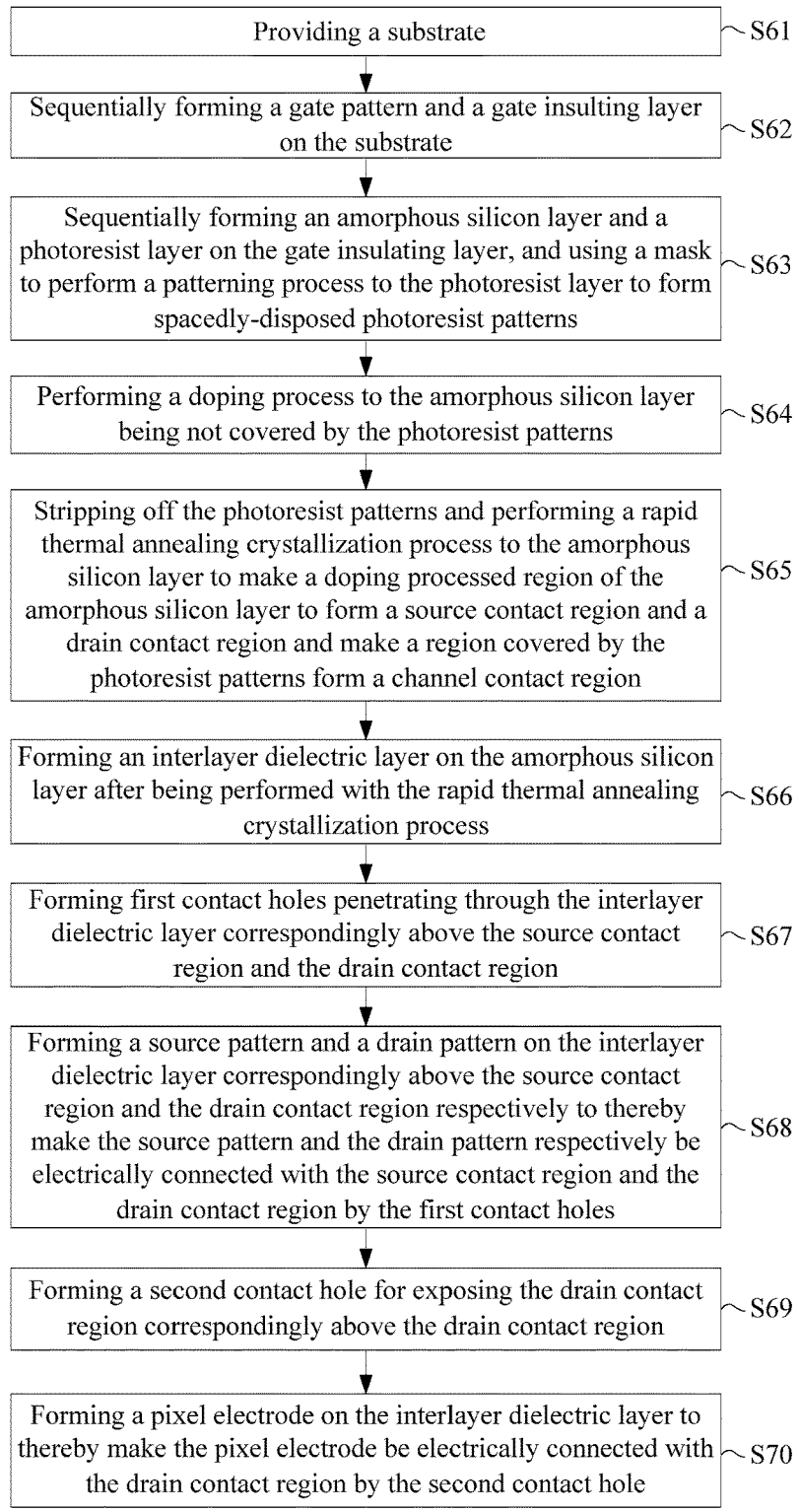
FIG. 6 is a flowchart of a manufacturing method of an array substrate according to another embodiment of the invention.

Since the gate pattern G is formed above the channel region $Z_G$, the array substrate of the embodiment can be regarded as having a top-gate TFT structure. Of course, an embodiment of the invention may be adapted for an array substrate having a bottom-gate TFT structure. Referring to FIG. 6, a manufacturing method of an array substrate may include steps of S61~S70.

S61: providing a substrate.

S62: sequentially forming a gate pattern and a gate insulting layer on the substrate.

S63: sequentially forming an amorphous silicon layer and a photoresist layer on the gate insulating layer, and using a mask to perform a patterning process to the photoresist layer to form spacedly-disposed photoresist patterns.

S64: performing a doping process to the amorphous silicon layer being not covered by the photoresist patterns.

S65: stripping off the photoresist patterns and performing a rapid thermal annealing crystallization process to the amorphous silicon layer to thereby make a doping processed region of the amorphous silicon layer form a source contact region and a drain contact region and make a region covered by the photoresist patterns form a channel region.

S66: forming an interlayer dielectric layer on the amorphous silicon layer after being performed with the rapid thermal annealing crystallization process.

S67: forming first contact holes penetrating through the interlayer dielectric layer correspondingly above the source contact region and the drain contact region.

S68: forming a source pattern and a drain pattern on the interlayer dielectric layer correspondingly above the source contact region and the drain contact region respectively to thereby make the source pattern and the drain pattern respectively be electrically connected with the source contact region and the drain contact region by the first contact holes.

S69: forming a second contact hole for exposing the drain contact region correspondingly above the drain contact region.

S70: forming a pixel electrode on the interlayer dielectric layer to thereby make the pixel electrode be electrically connected with the drain contact region by the second contact hole.

The first contact holes of this embodiment may be regarded as the contact holes of the embodiment shown in FIG. 3 as above mentioned. The steps of S61~S68 are the same as the steps of S31~S38 of the embodiment shown in FIG. 3. The second contact hole formed by the steps of S69 and S70 of this embodiment is used to electrically connect with the pixel electrode and the drain contact region.

Figure 5:
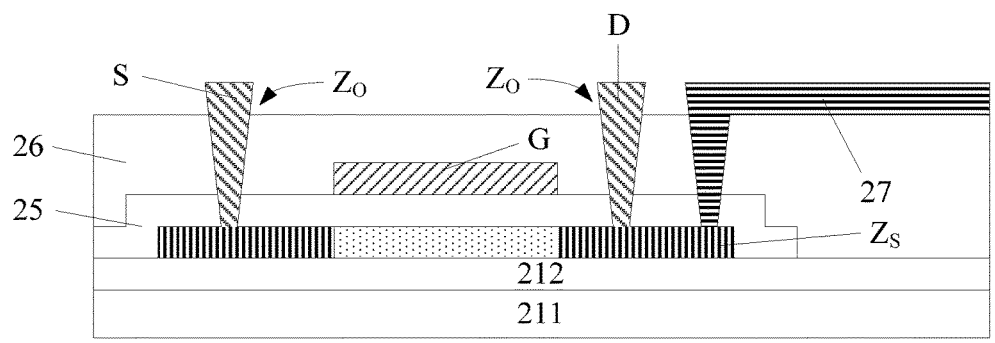
FIG. 5 is a structural cross-sectional view of an array substrate obtained by the manufacturing method according to the illustration of FIG. 4.

In summary, the array substrates prepared by the embodiments illustrated in FIG. 4 through FIG. 6 also can achieve directional crystallization, the materials and shapes to-be-formed of respective structural elements can refer to the foregoing description, and therefore can achieve same beneficial effects as the manufacturing methods of a thin film transistor as above mentioned.

It should be understood that the foregoing discussion only is some embodiments of the invention, and therefore it is not limited to the protection scope of the invention, any equivalent structures or equivalent transformation of processes made based on the specification and the accompanying drawings of the invention, such as the mutual combination of technical features of various embodiments, or directly or indirectly used in other related technical field, are similarly included within the protection scope of the invention.

What is claimed is:

1. A manufacturing method of a thin film transistor, wherein the manufacturing method comprises:
   providing a substrate;
   sequentially forming an amorphous silicon layer and a photoresist layer on the substrate, using a mask to perform a patterning process to the photoresist layer to form spacedly-disposed photoresist patterns;
   performing a doping process to the amorphous silicon layer being not covered by the photoresist patterns, wherein dopant ions in the doping process comprise boron ions;
   stripping off the photoresist patterns and performing a rapid thermal annealing crystallization process to the amorphous silicon layer to thereby make a doping processed region of the amorphous silicon layer form a source contact region and a drain contact region and make a region covered by the photoresist patterns form a channel region;
   forming a gate insulating layer on amorphous silicon layer after being performed with the rapid thermal annealing crystallization process; and
   forming a gate pattern on the gate insulating layer, and the gate pattern being located between the source contact region and the drain contact region and correspondingly located above the channel region;
   wherein the step of sequentially forming an amorphous silicon layer and a photoresist layer on the substrate comprises: sequentially forming a gate pattern and a gate insulting layer on the substrate; and sequentially forming the amorphous silicon layer and the photoresist layer on the gate insulting layer.

2. The manufacturing method according to claim 1, wherein the manufacturing method further comprises:
   forming an inter layer dielectric layer on the gate pattern;
   forming contact holes penetrating through the inter layer dielectric layer and the gate insulating layer correspondingly above the source contact region and the drain contact region; and
   forming a source pattern and a drain pattern on the interlayer dielectric layer correspondingly above the source contact region and the drain contact region respectively to thereby make the source pattern and the drain pattern respectively be electrically connected with the source contact region and the drain contact region by the contact holes.

3. A manufacturing method of a thin film transistor, wherein the manufacturing method comprises:
   providing a substrate;
   sequentially forming an amorphous silicon layer and a photoresist layer on the substrate, using a mask to perform a patterning process to the photoresist layer to form spacedly-disposed photoresist patterns;
   performing a doping process to the amorphous silicon layer being not covered by the photoresist patterns; and
   stripping off the photoresist patterns and performing a rapid thermal annealing crystallization process to the amorphous silicon layer to thereby make a doping processed region of the amorphous silicon layer form a source contact region and a drain contact region and make a region covered by the photoresist patterns form a channel region;
   wherein the step of sequentially forming an amorphous silicon layer and a photoresist layer on the substrate comprises: sequentially forming a gate pattern and a gate insulting layer on the substrate; and sequentially forming the amorphous silicon layer and the photoresist layer on the gate insulting layer.

4. The manufacturing method according to claim 3, wherein the manufacturing method further comprises:
   forming a gate insulating layer on the amorphous silicon layer after being performed with the rapid thermal annealing crystallization process; and
   forming a gate pattern on the gate insulating layer, and the gate pattern being located between the source contact region and the drain contact region and correspondingly located above the channel region.

5. The manufacturing method according to claim 4, wherein the manufacturing method further comprises:
   forming an interlayer dielectric layer on the gate pattern;
   forming contact holes penetrating through the interlayer dielectric layer and the gate insulting layer correspondingly above the source contact region and the drain contact region; and
   forming a source pattern and a drain pattern on the interlayer dielectric layer correspondingly above the source contact region and the drain contact region respectively to thereby make the source pattern and the drain pattern respectively be electrically connected with the source contact region and the drain contact region by the contact holes.

6. The manufacturing method according to claim 3, wherein the manufacturing method further comprises:
   forming an interlayer dielectric layer on the amorphous silicon layer after being performed with the rapid thermal annealing crystallization process;
   forming contact holes penetrating through the interlayer dielectric layer correspondingly above the source contact region and the drain contact region; and
   forming a source pattern and a drain pattern on the interlayer dielectric layer correspondingly above the source contact region and the drain contact region respectively to thereby make the source pattern and the drain pattern respectively be electrically connected with the source contact region and the drain contact region by the contact holes.

7. The manufacturing method according to claim 3, wherein dopant ions in the doping process comprise boron ions.

8. A manufacturing method of an array substrate, wherein the manufacturing method comprises:
   providing a substrate;
   sequentially forming an amorphous silicon layer and a photoresist layer on the substrate, using a mask to perform a patterning process to the photoresist layer to form spacedly-disposed photoresist patterns;
   performing a doping process to the amorphous silicon layer being not covered by the photoresist patterns;
   stripping off the photoresist patterns and performing a rapid thermal annealing crystallization process to the amorphous silicon layer to thereby make a doping processed region of the amorphous silicon layer form a source contact region and a drain contact region and make a region covered by the photoresist patterns form a channel region;
   forming an interlayer dielectric layer on the amorphous silicon layer after being performed with the rapid thermal annealing crystallization process;
   forming first contact holes penetrating through the interlayer dielectric layer correspondingly above the source contact region and the drain contact region;

forming a source pattern and a drain pattern on the interlayer dielectric layer correspondingly above the source contact region and the drain contact region respectively to thereby make the source pattern and the drain pattern respectively be electrically connected with the source contact region and the drain contact region by the first contact holes;

forming a second contact hole for exposing the drain contact region correspondingly above the drain contact region;

forming a pixel electrode on the interlayer dielectric layer to thereby make the pixel electrode be electrically connected with the drain contact region by the second contact hole; and wherein the step of sequentially forming an amorphous silicon layer and a photoresist layer on the substrate comprises: sequentially forming a gate pattern and a gate insulting layer on the substrate; and sequentially forming the amorphous silicon layer and the photoresist layer on the gate insulating layer.

9. The manufacturing method according to claim 8, wherein the step of forming an interlayer dielectric layer on the amorphous silicon layer after being performed with the rapid thermal annealing crystallization process comprises:

forming a gate insulating layer on the amorphous silicon layer after being performed with the rapid thermal annealing crystallization process;

forming a gate pattern on the gate insulating layer, and the gate pattern being located between the source contact region and the drain contact region and correspondingly located above the channel region; and forming the inter layer dielectric layer on the gate pattern; and the step of forming first contact holes penetrating through the interlayer dielectric layer correspondingly above the source contact region and the drain contact region comprises:

forming the first contact holes penetrating through the interlayer dielectric layer and the gate insulating layer correspondingly above the source contact region and the drain contact region.

10. The manufacturing method according to claim 8, wherein dopant ions in the doping process comprise boron ions.

* * * * *